(12) United States Patent
Sekine

(10) Patent No.: US 6,476,414 B1
(45) Date of Patent: Nov. 5, 2002

(54) SEMICONDUCTOR DEVICE

(75) Inventor: Namiki Sekine, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/641,729

(22) Filed: Aug. 21, 2000

(30) Foreign Application Priority Data

Aug. 19, 1999 (JP) ............................................ 11-232684

(51) Int. Cl.[7] .......................... H01L 23/58; H01L 21/66
(52) U.S. Cl. .............................. 257/48; 257/288; 438/15
(58) Field of Search .......................... 257/48, 392, 213, 257/288; 438/17, 18

(56) References Cited

U.S. PATENT DOCUMENTS 5,359,296 A * 10/1994 Brooks et al. .............. 330/288
5,796,767 A * 8/1998 Aizawa
5,966,005 A * 10/1999 Fujimori ...................... 323/315

FOREIGN PATENT DOCUMENTS

JP           9-251059           9/1997

* cited by examiner

*Primary Examiner*—Olik Chaudhuri
*Assistant Examiner*—Dilinh Nguyen
(74) *Attorney, Agent, or Firm*—McGinn & Gibb, PLLC

(57) ABSTRACT

In order to precisely estimate a gate length of a MOS transistor in a semiconductor device, the semiconductor device comprises a pair of MOS transistors having different gate lengths. A threshold voltage difference between the MOS transistors is measured by flowing the same amount of current through each of the MOS transistors. The gate length of the MOS transistor can be precisely estimated from the threshold voltage difference thus obtained.

9 Claims, 2 Drawing Sheets

SEMICONDUCTOR DEVICE

BACKGROUND OF THE INVENTION

The present invention relates to a semiconductor device, and more specifically to a semiconductor device capable of precisely estimating a gate length of a MOS transistor.

In the prior art, the gate length of a MOS transistor is measured in the process of a semiconductor device fabrication, by preparing a monitor pattern (check transistor) on a wafer and by physically measuring the gate length L of the check transistor by use of a length measuring SEM (scanning electron microscope).

However, the above mentioned measuring method can no longer ensure a satisfactory precision of the length measurement because of a recent tendency of shortening of the gate length for the microminiaturization of the semiconductor device. In addition, since the above mentioned measuring method is a localized measurement, an error on the order of ±0.01 μm will occur because of the influence of a gate shape and dependently upon the manner of measurement, with the result that it is impossible to grasp a precise gate length.

Furthermore, the above mentioned measuring method is convenient in checking a difference between patterns. However, since the above mentioned measuring method is carried out in the process of the semiconductor device fabrication, when it is desired to carry out a number of measurements such as a full-chip measurement and a full-number measurement, it is unsuitable because it is needs time and because there is a high degree of possibility that dust is deposited on the wafer.

Under this circumstance, another gate length measuring method as shown in FIG. 1 may be considered by persons skilled in the art although it is not well known. This gate length measuring method is intended to an electrical characteristics in order to realize a measurement precision higher than that obtained in the above mentioned physical measurement of the size.

In the gate length measuring method as shown in FIG. 1, a gate voltage Vg of a single MOS transistor 12 when a predetermined current Io starts to flow through the MOS transistor 12 is considered to be a threshold voltage Vt (Vg=Vt). As shown by a plotted line 11 in FIG. 3, a gate voltage-gate length (Vt-L) characteristics Vt(1) is prepared by measuring the threshold voltage Vt of various MOS transistors which were formed under the same fabricating condition to have different predetermined gate lengths. In FIG. 3, the axis of abscissas Lpoly indicates the gate length in terms of micrometer, and the threshold voltage Vt is indicated by the axis of ordinates at a left side in terms of volt.

Thus, the gate voltage Vg of the MOS transistor 12 shown in FIG. 1 when a predetermined current Io (for example, 1 μA) starts to flow through the MOS transistor 12 is measured as the threshold voltage Vt, and a gate length of the MOS transistor 12 is estimated from the measured gate voltage Vt and the previously prepared Vt-L characteristics Vt(1) as shown in FIG. 3.

In the gate length measuring method shown in FIG. 1, however, the measured gate voltage Vt of the MOS transistor 12 does not necessarily correspond to the actual gate length L of the MOS transistor 12, because an estimated gate length is deviated from the actual gate length L when the Vt-L characteristics Vt(1) was shifted to a distinct Vt-L characteristics Vt(2) as designated by the reference number 10 in FIG. 3 because of unintentional causes such as unpreferable remaining charges.

The reason for this will be described briefly. The gate voltage (threshold voltage) Vt, which is one fundamental characteristics of the MOS transistor, is influenced by not only the gate length L but also the other factors including the thickness of a gate oxide film, the surface concentration of a silicon substrate, the existence of electric charges at a boundary between the gate oxide film and the silicon substrate, the existence of electric charges within the gate oxide film, etc.

Since the degree of influence to the gate voltage (threshold voltage) Vt, of variation of the electric charges existing within the gate oxide film and at the boundary between the gate oxide film and the silicon substrate, was small hitherto, it was considered that if the precision of the gate oxide film thickness and the substrate surface concentration was elevated in the fabricating process, it is possible to presume the gate length L from the gate voltage (threshold voltage) Vt.

Recently, however, the value of the gate voltage (threshold voltage) Vt has become small, with the result that it has become unallowable to ignore the shift of the gate voltage (threshold voltage) Vt, caused by factors such as the electric charges existing within the gate oxide film and at the boundary between the gate oxide film and the silicon substrate, other than the gate oxide film thickness and the substrate surface concentration.

Since the variation of the above mentioned electric charges occurs in various situations in the process of the semiconductor device fabrication, it is difficult to control the electric charges in question, differently from the gate oxide film thickness and the substrate surface concentration. Therefore, it is unavoidable that the gate voltage (threshold voltage) Vt is often shifted because of the influence of the uncontrollable remaining electric charges.

Therefore, although the gate voltage (threshold voltage) Vt was shifted by the uncontrollable remaining electric charges to assume the Vt-L characteristics Vt(1) shown in FIG. 3, if the gate length is estimated by applying the measured gate voltage Vt to the Vt-L characteristics Vt(2) which was obtained by measuring the gate voltage (threshold voltage) Vt of various MOS transistors which were formed under the same fabricating condition to have the same gate oxide film thickness and the same substrate surface concentration but to have different gate lengths, the estimated gate length is resultantly deviated from the actual gate length L.

BRIEF SUMMARY OF THE INVENTION

Accordingly, it is an object of the present invention to provide a semiconductor device capable of precisely estimating a gate length of a MOS transistor, without being influenced by the uncontrollable remaining electric charges.

The above and other objects of the present invention are achieved in accordance with the present invention by a semiconductor device having a checking pattern composed of a combination of MOS transistors having different gate lengths so that a threshold voltage difference can be measured.

According to the present invention, there is provided a semiconductor device having a checking pattern composed of a combination of MOS transistors having different gate lengths so that a threshold voltage difference between the MOS transistors can be measured by flowing a current through the MOS transistors.

As seen from the above, in order to obtain the gate length of the MOS transistor, according to the present invention, the physical measurement of a gate length is not executed in the process of a semiconductor device fabrication, nor is the estimation carried out on the basis of the electrical characteristics (threshold voltage Vt) obtained from the electrical measurement of a single MOS transistor. According to the present invention, the gate length of the MOS transistor can be precisely estimated on the basis of a threshold voltage difference (dVt) between two MOS transistors having different gate lengths, which were formed in the same semiconductor device fabricating process and which are combined to form the checking pattern.

The above and other objects, features and advantages of the present invention will be apparent from the following description of preferred embodiments of the invention with reference to the accompanying drawings.

DETAILED DESCRIPTION OF THE INVENTION

Figure 2:
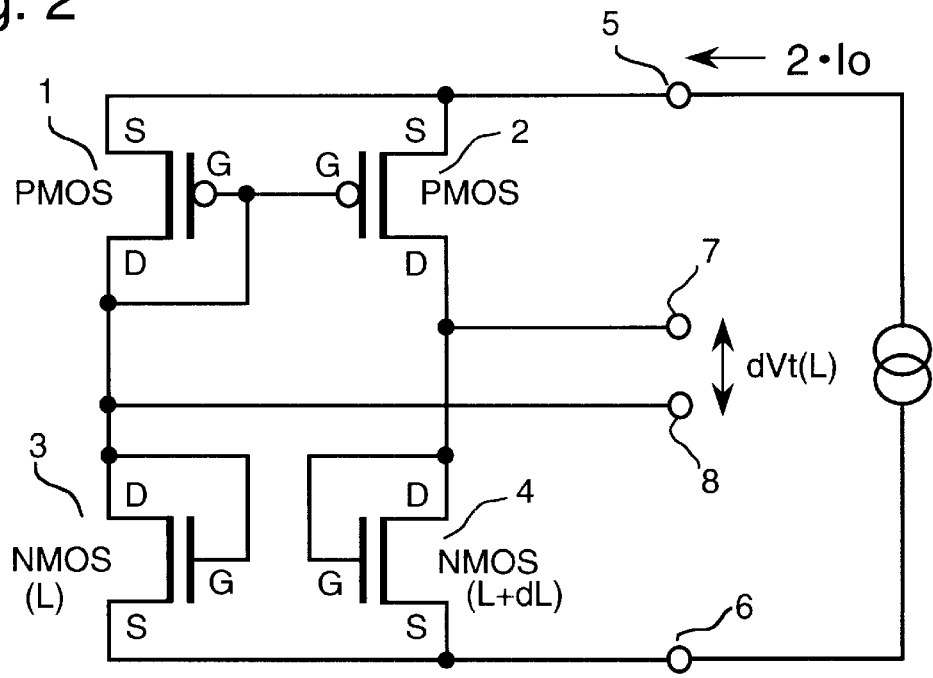
FIG. 2 is a circuit diagram for illustrating one embodiment of the semiconductor device in accordance with the present invention, capable of precisely estimating a gate length of a MOS transistor.

Referring to FIG. 2, there is shown a circuit diagram for illustrating one embodiment of the semiconductor device in accordance with the present invention, capable of precisely estimating the gate length of the MOS transistor.

The semiconductor device in accordance with the present invention includes a checking pattern as shown in FIG. 2, which comprises a pair of PMOS transistors 1 and 2 connected to constitute a current mirror circuit. Namely, respective sources of the PMOS transistors 1 and 2 are connected to a high voltage terminal 5, and respective gates of the PMOS transistors 1 and 2 are connected to each other. A drain and the gate of one of the PMOS transistors 1 and 2 (the transistor 1 in the shown circuit) are connected to each other.

The pair of PMOS transistors 1 and 2 constituting the current mirror circuit are formed to have the same characteristics (for example, the same gate length and the same gate width) so that the PMOS transistors 1 and 2 can flow the same amount of current.

The checking pattern shown in FIG. 2 further includes an NMOS transistor 3 having a gate length L and having a drain connected to the drain of the PMOS transistor 1, and another NMOS transistor 4 having a gate length $\{L+dL\}$ and having a drain connected to the drain of the PMOS transistor 2. Respective sources of the NMOS transistors 3 and 4 are connected to a low voltage terminal 6. A gate of the NMOS transistor 3 is connected to the drain of the NMOS transistor 3 itself, and a gate of the NMOS transistor 4 is connected to the drain of the NMOS transistor 4 itself. The drain of the NMOS transistor 3 is connected to an output terminal 7, and the drain of the NMOS transistor 4 is connected to an output terminal 8.

In this circuit, a current 2Io which is two times a current Io (for example, 1 $\mu$A) caused to flow at the time of measuring a threshold voltage (gate voltage) Vt in a conventional manner, for example 2 $\mu$A, is supplied between the terminals 5 and 6 to be supplied to the current mirror circuit. As mentioned above, since the PMOS transistors 1 and 2 flow the same amount of current, the current Io (for example, 1 $\mu$A) is caused to flow through each of the NMOS transistors 3 and 4 having the different gate lengths. As a result, a voltage difference appears between the output terminals 7 and 8 because the NMOS transistors 3 and 4 have the different gate lengths and therefore should have different thresholds. Therefore, a voltage difference dVt between the output terminals 7 and 8 is measured.

Figure 1:
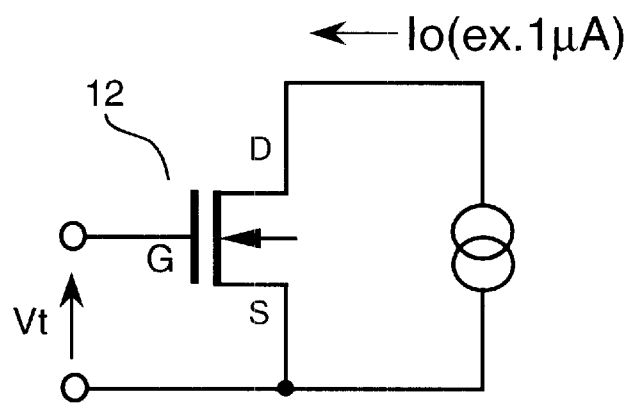
FIG. 1 is a circuit diagram for illustrating a gate length measuring method which may be considered by persons skilled in the art although it is not well known.
Figure 3:
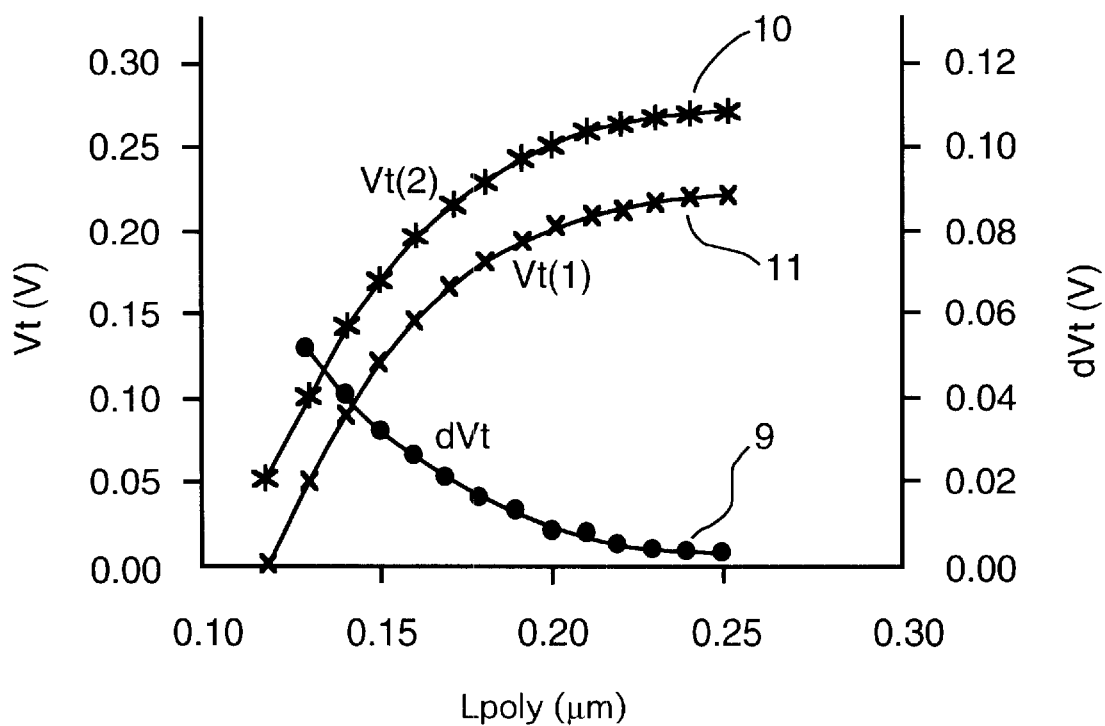
FIG. 3 is a graph for illustrating the principle of the gate length measuring method utilizing the circuit shown in FIG. 1 and the principle of the gate length measuring method utilizing the semiconductor device in accordance with the present invention.

This voltage difference dVt is previously measured in a number of checking patterns which were formed in the same fabricating process to have different "L"s but to have the same $\{+dL\}$ and the same values in the other characteristics. For example, the dVt-L characteristics 9 shown in FIG. 9 was obtained by reducing "L" from "0.25 $\mu$m" with intervals of "0.01 $\mu$m" while maintaining the $\{\pm dL\}$ at "−0.01 $\mu$m". Accordingly, in the graph of FIG. 3, a difference dVt between Vt of the transistor having the gate length of 0.25 $\mu$m and Vt of the transistor having the gate length of 0.24 $\mu$m, was plotted at Lpoly=0.25 $\mu$m. In FIG. 3, the threshold difference dVt is indicated by the axis of ordinates at a right side in terms of volt.

Thus, the dVt-L characteristics 9 are previously prepared. In this condition, the checking pattern having the circuit structure shown in FIG. 2 is formed in a semiconductor device, and the voltage difference dVt between the output terminals 7 and 8 is measured. The gate length is estimated by applying the voltage difference dVt thus obtained, to the dVt-L characteristics 9. This estimation of the gate length is very precise. The reason for this will be explained in the following.

When the circuit structure shown in FIG. 2 is used to monitor the voltage difference dVt, since the transistors 3 and 4 are designed to have the same structure other than the gate length, and since the transistors 3 and 4 are formed in the same fabricating process, the transistors 3 and 4 have the same characteristics excluding the gate length. Therefore, even if the gate voltage (threshold) Vt of the transistors is shifted under the influence of uncontrollable remaining electric charges, the shift amount of the gate voltage (threshold) Vt of the transistors 3 and 4 are considered to be the same. Therefore, if the voltage difference dVt between the gate voltage (threshold) Vt of the transistors 3 and 4 is measured, it is possible to cancel the influence of the shift of the gate voltage (threshold) Vt of the transistors 3 and 4 caused by the uncontrollable remaining electric charges. Accordingly, it is possible to precisely estimate the gate length L by measuring the voltage difference dVt and converting the measured voltage difference dVt into the gate length by use of the dVt-L characteristics 9 shown in FIG. 3.

In the embodiment shown in FIG. 2, the pair of NMOS transistors 3 and 4 have different gate lengths. However, a pair of PMOS transistors can have different gate lengths.

Figure 4:
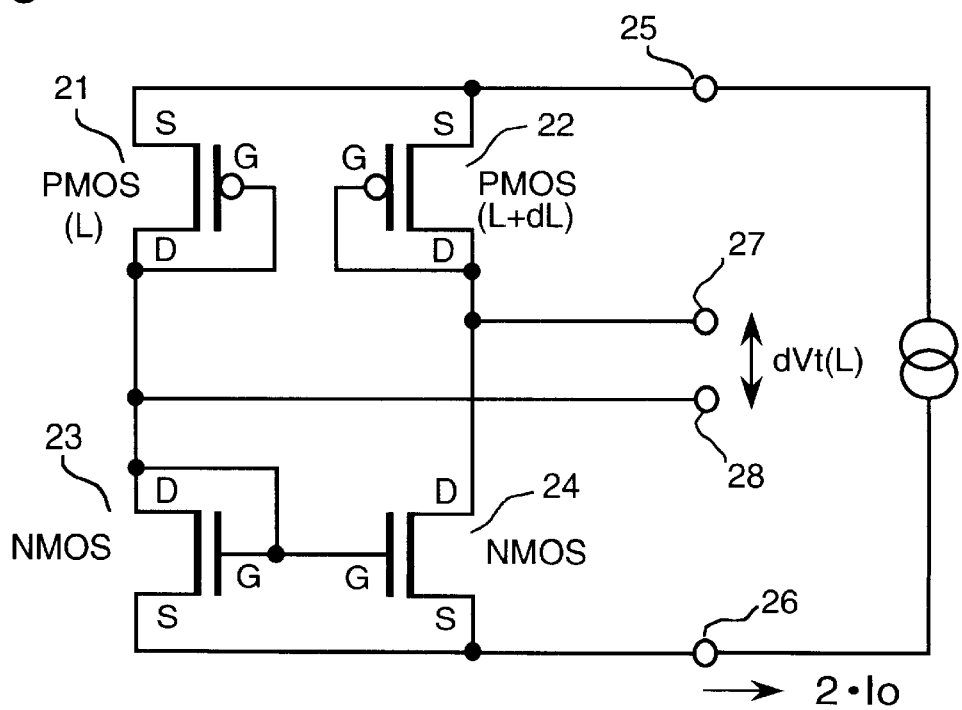
FIG. 4 is a circuit diagram for illustrating another embodiment of the semiconductor device in accordance with the present invention, capable of precisely estimating the gate length of the MOS transistor.

Referring to FIG. 4, there is shown a circuit diagram for illustrating another embodiment of the semiconductor device in accordance with the present invention, capable of precisely estimating the gate length of the MOS transistor.

This embodiment includes a checking pattern as shown in FIG. 4, which is very similar to the checking pattern as shown in FIG. 2. The shown checking pattern comprises a pair of NMOS transistors 23 and 24 connected to constitute a current mirror circuit. Namely, respective sources of the NMOS transistors 23 and 24 are connected to a low voltage terminal 26, and respective gates of the NMOS transistors 23 and 24 are connected to each other. A drain and the gate of one of the NMOS transistors 23 and 24 (the transistor 23 in the shown circuit) are connected to each other.

The pair of NMOS transistors 23 and 24 constituting the current mirror circuit are formed to have the same characteristics so that the NMOS transistors 23 and 24 can flow the same amount of current.

The checking pattern shown in FIG. 4 further includes a PMOS transistor 21 having a gate length L and having a drain connected to the drain of the NMOS transistor 23, and another PMOS transistor 22 having a gate length {L+dL} and having a drain connected to the drain of the PMOS transistor 24. Respective sources of the PMOS transistors 21 and 22 are connected to a high voltage terminal 25. A gate of the PMOS transistor 21 is connected to the drain of the PMOS transistor 21 itself, and a gate of the PMOS transistor 22 is connected to the drain of the PMOS transistor 22 itself. The drain of the PMOS transistor 22 is connected to an output terminal 27, and the drain of the PMOS transistor 21 is connected to an output terminal 28.

In this circuit, a current 2Io which is two times a current Io caused to flow at the time of measuring a threshold voltage (gate voltage) Vt in a conventional manner is supplied between the terminals 25 and 26 to be supplied to the current mirror circuit. As mentioned above, since the NMOS transistors 23 and 24 flow the same amount of current, the current Io is caused to flow through each of the PMOS transistors 21 and 22 having the different gate lengths. As a result, a voltage difference appears between the output terminals 27 and 28 because the PMOS transistors 21 and 22 have the different gate lengths and therefore should have different thresholds. Therefore, a voltage difference dVt between the output terminals 27 and 28 is measured, similarly to the first embodiment.

Since it would be apparent to persons skilled in the art with no further explanation that, by using the checking pattern having the circuit construction shown in FIG. 4, the gate length can be precisely estimated similarly to the case shown in FIG. 2, a further explanation will be omitted.

As seen from the above, according to the present invention, since the threshold voltage difference between transistors which were formed in the same fabricating process to have different gate lengths, is monitored, it is possible to precisely estimate the gate length of the MOS transistors by canceling the influence of the uncontrollable charges to the gate voltage (threshold) Vt of the transistor.

Accordingly, the relation between the electrical characteristics and the gate length can be precisely known from the gate length thus precisely estimated, with the result that it is possible to fabricate LSIs having a reduced variation in performance, by feeding back the relation between the electrical characteristics and the gate length.

The invention has thus been shown and described with reference to the specific embodiments. However, it should be noted that the present invention is in no way limited to the details of the illustrated structures but changes and modifications may be made within the scope of the appended claims.

I claim:

1. A semiconductor device, comprising:
   a plurality of checking patterns, each of the plurality of checking patterns including a first MOS transistor of a first carrier type, having one of a plurality of gate lengths, L, and a second MOS transistor of the first carrier type, having one of a plurality of gate lengths, L+dL, connected in parallel, wherein
      an output, resulting from a current of a MOS transistor of a second carrier type that is applied to the first and second MOS transistors, provides a threshold voltage difference between the first and second MOS transistors of at least one of the plurality of checking patterns.

2. A semiconductor device, comprising:
   a plurality of checking patterns, each of the plurality of checking patterns including a first MOS transistor of a first carrier type, having one of a plurality of gate lengths, L, and a second MOS transistor of the first carrier type, having one of a plurality of gate lengths, L+dL, connected in parallel, wherein
      a threshold voltage difference from at least one of the plurality of checking patterns results from an application of a predetermined current from a current mirror of MOS transistors of a second carrier type to the first and second MOS transistors to the at least one of the plurality of checking patterns.

3. A semiconductor device having a checking pattern composed of a high voltage terminal, a low voltage terminal, a current mirror circuit having a pair of current paths flowing the same amount of current, one end of each of said pair of current paths being connected to one of said high voltage terminal and said low voltage terminal, a first MOS transistor having a source-drain path connected between the other end of one of said pair of current paths and the other of said high voltage terminal and said low voltage terminal, said first MOS transistor having a gate connected to a drain of said first MOS transistor, and a second MOS transistor of the same channel type as that of said first MOS transistor, said second MOS transistor having a source-drain path connected between the other end of the other of said pair of current paths and the other of said high voltage terminal and said low voltage terminal, said second MOS transistor having a gate connected to a drain of said second MOS transistor, said second MOS transistor having a gate length different from that of said first MOS transistor so that when the same amount of current is flowed through each of said first and second MOS transistors by said current mirror circuit, a voltage difference appears between said gate of said first MOS transistor and said gate of said second MOS transistor.

4. A semiconductor device claimed in claim 3 wherein said gate length of said second MOS transistor is different from said gate length of said first MOS transistor by a predetermined length.

5. A semiconductor device claimed in claim 3 wherein said one end of each of said pair of current paths in said current mirror circuit is connected to said high voltage terminal and wherein said first MOS transistor is a first NMOS transistor having a source connected to said low voltage terminal, a drain of said first NMOS transistor being connected to the other end of one of said pair of current paths, and said second MOS transistor is a second NMOS transistor having a source connected to said low voltage terminal, a drain of said second NMOS transistor being connected to the other end of the other of said pair of current paths.

6. A semiconductor device claimed in claim 3 wherein said one end of each of said pair of current paths in said current mirror circuit is connected to said low voltage terminal and wherein said first MOS transistor is a first PMOS transistor having a source connected to said high voltage terminal, a drain of said first PMOS transistor being connected to the other end of one of said pair of current paths, and said second MOS transistor is a second PMOS transistor having a source connected to said high voltage terminal, a drain of said second PMOS transistor being connected to the other end of the other of said pair of current paths.

7. A semiconductor device, having N-type and P-type MOS transistors, that forms a checking pattern, comprising:

a pair of MOS transistors of a first type, configured as a current mirror;

a first MOS transistor of a second type, having a gate length, L;

a second MOS transistor of the second type, having a gate length, L+dL, wherein a drain and a gate of the first MOS transistor are connected to a drain of one of the pair of MOS transistors, and a drain and a gate of the second MOS transistor are connected to a drain of another one of the pair of MOS transistors.

8. A semiconductor device that forms a checking pattern claimed in claim 7, wherein the drain of the first MOS transistor and the drain of the second MOS transistor provide a threshold voltage difference.

9. A semiconductor device that forms a checking pattern claimed in claim 7, wherein a predetermined current is applied across the pair of MOS transistors of the first type and the first and second MOS transistors of the second type.

* * * * *